United States Patent
Tsao et al.

(10) Patent No.: US 11,309,342 B2
(45) Date of Patent: Apr. 19, 2022

(54) DUMMY VERTICAL TRANSISTOR STRUCTURE TO REDUCE CROSS TALK IN PIXEL SENSOR

(71) Applicant: Taiwan Semiconductor Manufacturing Co., Ltd., Hsin-Chu (TW)

(72) Inventors: Tsun-Kai Tsao, Tainan (TW); Jiech-Fun Lu, Madou Township (TW); Shih-Pei Chou, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 129 days.

(21) Appl. No.: 16/579,726

(22) Filed: Sep. 23, 2019

(65) Prior Publication Data

US 2021/0091127 A1    Mar. 25, 2021

(51) Int. Cl.
*H04N 9/04* (2006.01)
*H01L 27/146* (2006.01)

(52) U.S. Cl.
CPC .... *H01L 27/14603* (2013.01); *H01L 27/1463* (2013.01); *H01L 27/1464* (2013.01); *H01L 27/14616* (2013.01); *H01L 27/14621* (2013.01); *H01L 27/14627* (2013.01); *H01L 27/14629* (2013.01); *H01L 27/14636* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 2012/0161267 A1* | 6/2012 | Ezaki | H01L 27/14621 257/431 |
| 2014/0246707 A1* | 9/2014 | Koo | H01L 27/14614 257/230 |
| 2015/0163425 A1 | 6/2015 | Oganesian et al. | |

(Continued)

FOREIGN PATENT DOCUMENTS

WO    2019159711 A1    8/2019

*Primary Examiner* — Ali Naraghi
(74) *Attorney, Agent, or Firm* — Eschweiler & Potashnik, LLC

(57) ABSTRACT

Various embodiments of the present disclosure are directed towards a pixel sensor including a dummy vertical transistor structure underlying a photodetector. The pixel sensor includes a substrate having a front-side surface opposite a back-side surface. The photodetector is disposed within the substrate. A deep trench isolation (DTI) structure extends from the back-side surface of the substrate to a first point below the back-side surface. The DTI structure wraps around an outer perimeter of the photodetector. The dummy vertical transistor structure is laterally spaced between inner sidewalls of the DTI structure. The dummy vertical transistor structure includes a dummy vertical gate electrode having a dummy conductive body and a dummy embedded conductive structure. The dummy embedded conductive structure extends from the front-side surface of the substrate to a second point vertically above the first point and the dummy conductive body extends along the front-side surface of the substrate.

20 Claims, 11 Drawing Sheets

(56) References Cited

U.S. PATENT DOCUMENTS

| | | | |
|---|---|---|---|
| 2016/0056200 A1* | 2/2016 | Lee | H01L 27/1464 250/208.1 |
| 2016/0172391 A1* | 6/2016 | Ihara | H01L 27/14685 438/70 |
| 2019/0252447 A1 | 8/2019 | Toda | |
| 2020/0077055 A1* | 3/2020 | Kim | H01L 27/14623 |
| 2020/0266221 A1 | 8/2020 | Uchida et al. | |

\* cited by examiner

DUMMY VERTICAL TRANSISTOR STRUCTURE TO REDUCE CROSS TALK IN PIXEL SENSOR

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
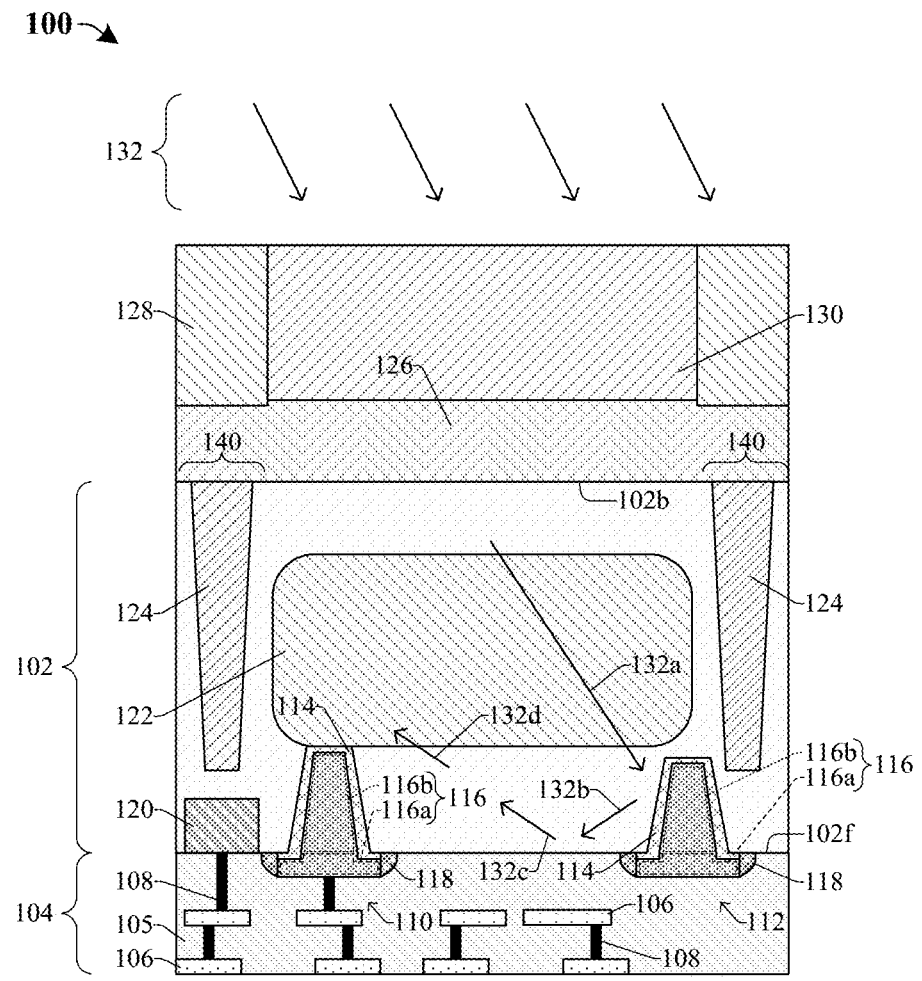
FIG. 1 illustrates a cross-sectional view of some embodiments of a pixel sensor having a dummy vertical transistor structure underlying a photodetector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

Some complementary metal-oxide semiconductor image sensors (CISs) have an array of pixel sensors. A pixel sensor records incident radiation (e.g., visible light) using a photodetector, and facilitates digital readout of the recording with a plurality of pixel devices (e.g., a transfer transistor, a reset transistor, a source follower transistor, etc.) disposed on a front-side of a substrate. Some pixel sensors comprise an array of photodetectors (e.g., a 2×2 photodetector pixel sensor). In such pixel sensors, the array of photodetectors are disposed around a floating diffusion node. A deep trench isolation (DTI) structure laterally surrounds each photodetector and is configured to electrically isolate the photodetectors and/or pixel devices from one another. An interconnect structure (e.g., conductive wires and conductive vias) overlies the front-side of the substrate and provides electrical coupling to the array of pixel sensors and/or the plurality of pixel devices.

One challenge with the above pixel sensor is cross talk between photodetectors across the array of pixel sensors. The cross talk is due to incident radiation disposed upon a first photodetector interacting with a second photodetector that is laterally adjacent to the first photodetector. The cross talk causes an imbalance in magnitude and/or phase of the incident radiation disposed upon each photodetector. For example, as incident radiation is disposed upon a back-side (the back-side is opposite the front-side) of the substrate it hits a first photodetector. However, at least a portion of the incident radiation radiates through the substrate to the front-side of the substrate and reflects off of conductive materials within the interconnect structure. The reflected portion of the incident radiation may hit and/or be absorbed by the second photodetector. Thus, a lack of isolation between adjacent photodetectors in the array of pixel sensors may cause the cross talk between adjacent photodetectors, such that when equal amounts of incident radiation are present for a first and a second photodetector, the first photodetector will receive less incident radiation than the adjacent second photodetector. This may increase noise, decrease reliability, and/or decrease sensitivity of the image sensor.

In some embodiments, the present application is directed towards a pixel sensor having a dummy vertical transistor structure underlying each photodetector. The pixel sensor records incident radiation using the plurality of photodetectors, and facilitates digital readout of the recording with a plurality of pixel devices. The pixel devices include a vertical transfer transistor disposed on a front-side of a substrate and beneath each photodetector. An interconnect structure is disposed along the front-side of the substrate and provides electrical coupling to the plurality of photodetectors and the plurality of pixel devices. A DTI structure laterally surrounds each photodetector and is configured to electrically isolate the pixel devices and/or photodetectors from one another. A dummy vertical transistor structure is disposed beneath each photodetector and between inner sidewalls of the DTI structure that laterally surrounds the corresponding photodetector. As incident radiation is disposed upon a back-side of the substrate it hits a first photodetector, a portion of the incident radiation radiates through the first photodetector towards the front-side of the substrate. This portion of the incident radiation may reflect off of the dummy vertical transistor structure and may be redirected back to the first photodetector. Thus, the dummy vertical transistor structure is configured to provide isolation between adjacent photodetectors in the array of photodetectors. This may decrease cross talk between photodetectors, increase a reliability of the image sensors, and/or increase an accuracy of images produced from the image sensor.

FIG. 1 illustrates a cross-sectional view of some embodiments of a pixel sensor 100 having a dummy vertical transistor structure 112.

The pixel sensor 100 includes an interconnect structure 104 disposed along a front-side surface 102f of a substrate 102. In some embodiments, the substrate 102 comprises any semiconductor body (e.g., bulk silicon) and/or has a first doping type (e.g., p-type doping). A photodetector 122 is disposed within the substrate 102 and is configured to convert incident electromagnetic radiation 132 (e.g., photons) into electrical signals (i.e., to generate electron-hole pairs from the incident electromagnetic radiation 132). The photodetector 122 comprises a second doping type (e.g., n-type doping) opposite the first doping type. In some embodiments, the first doping type is n-type and the second doping type is p-type, or vice versa. A floating diffusion node 120 is disposed along the front-side surface 102f of the substrate 102 and has the second doping type (e.g., n-type).

A vertical transfer transistor 110 and a dummy vertical transistor structure 112 are each disposed along the front-side surface 102f of the substrate 102. The vertical transfer transistor 110 and the dummy vertical transistor structure 112 each comprise a vertical gate electrode 116, a vertical gate dielectric layer 114, and a sidewall spacer structure 118. The vertical gate electrode 116 includes a conductive body 116a and an embedded conductive structure 116b extending from the conductive body 116a into the substrate 102. The embedded conductive structure 116b extends from the front-side surface 102f of the substrate 102 to a point vertically above the front-side surface 102f. The vertical gate dielectric layer 114 continuously surrounds the embedded conductive structure 116b and is configured to electrically isolate the vertical gate electrode 116 from the substrate 102. The sidewall spacer structure 118 continuously surrounds outer sidewalls of the vertical gate electrode 116. In some embodiments, the vertical gate electrode 116 is a single continuous material, such that the conductive body 116a and the embedded conductive structure 116b comprise a same material. The same material may, for example, be or comprise a conductive material, such as intrinsic polysilicon, aluminum, titanium, tungsten, a combination of the foregoing, or the like.

The interconnect structure 104 extends along the front-side surface 102f of the substrate 102 and is configured to electrically couple doped regions of the substrate 102 (e.g., the floating diffusion node 120, the photodetector 122, etc.) and pixel devices (e.g., the vertical transfer transistor 110) to one another. The interconnect structure 104 includes an interconnect dielectric structure 105, a plurality of conductive wires 106, and a plurality of conductive vias 108. A conductive via 108 directly contacts a bottom surface of the vertical gate electrode 116 of the vertical transfer transistor 110, such that the vertical transfer transistor 110 is electrically coupled to other conductive structures and/or layers (e.g., the conductive wires 106) disposed within the interconnect dielectric structure 105. The interconnect dielectric structure 105 continuous extends across an entire bottom surface of the vertical gate electrode 116 of the dummy vertical transistor structure 112, such that the dummy vertical transistor structure 112 is electrically isolated from other conductive structures and/or layers disposed within the interconnect dielectric structure 105.

A deep trench isolation (DTI) structure 124 extends into a back-side surface 102b of the substrate 102 to a point below the back-side surface 102b. In some embodiments, the DTI structure 124 is disposed within a peripheral region 140 of the pixel sensor 100 that laterally surrounds the photodetector 122. The photodetector 122 is disposed between inner sidewalls of the DTI structure 124. The DTI structure 124 is configured to electrically isolate the photodetector 122 from other semiconductor devices (e.g., other photodetectors (not shown)) disposed within and/or on the substrate 102. An upper dielectric structure 126 is disposed over the back-side surface 102b of the substrate 102. A grid structure 128 overlies the upper dielectric structure 126. The grid structure 128 may, for example, comprise a metal grid structure and/or a dielectric grid structure. The grid structure 128 is configured to direct the incident electromagnetic radiation 132 to the underlying photodetector 122. In some embodiments, when the grid structure 128 comprises the metal grid structure (e.g., aluminum, copper, tungsten, or a combination of the foregoing), incident electromagnetic radiation 132 may reflect off of sidewalls of the metal grid structure to the underlying photodetector 122 instead of traveling to an adjacent photodetector (not shown). In such embodiments, the grid structure 128 may decrease cross talk between adjacent photodetectors. The grid structure 128 surrounds a color filter 130. The color filter 130 overlies the photodetector 122 and is configured to pass a first range of frequencies of the incident electromagnetic radiation 132 while blocking a second range of frequencies of the incident electromagnetic radiation 132. The first range of frequencies is different than the second range of frequencies.

In some embodiments, as the incident electromagnetic radiation 132 hits the back-side surface 102b of the substrate 102, it may travel through the photodetector 122 towards the front-side surface 102f of the substrate. In some embodiments, the arrows 132a-d illustrate some non-limiting examples of a path of the incident electromagnetic radiation 132 as it travels through the substrate 102. A portion of the incident electromagnetic radiation 132 travels along a first arrow 132a that extends through a thickness of the photodetector 122 towards the peripheral region 140. Subsequently, the incident electromagnetic radiation 132 may bounce off of and/or reflect off of the vertical gate electrode 116 of the dummy vertical transistor structure 112 toward the front-side surface 102f of the substrate 102, as illustrated by a second arrow 132b. Further, the incident electromagnetic radiation 132 may bounce off of and/or reflect off of a conductive layer or structure (e.g., the conductive wires 106 and/or conductive vias 108) disposed within the interconnect structure 104, as illustrated by a third arrow 132c. Additionally, after reflecting off of the conductive structure or layer within the interconnect structure 104, the incident electromagnetic radiation 132 may hit and/or be absorbed by the photodetector 122, as illustrated by a fourth arrow 132d. Therefore, the dummy vertical transistor structure 112 is configured to redirect the incident electromagnetic radiation 132 away from the peripheral region 140 of the pixel sensor 100 towards the interconnect structure 104 and/or towards the photodetector 122. This may prevent the incident electromagnetic radiation 132 from traversing the peripheral region 140 to another photodetector (not shown) disposed within the substrate 102 and adjacent to the photodetector 122, thereby decreasing cross talk between adjacent photodetectors and increasing a sensitivity of the photodetector 122.

Figure 2A:
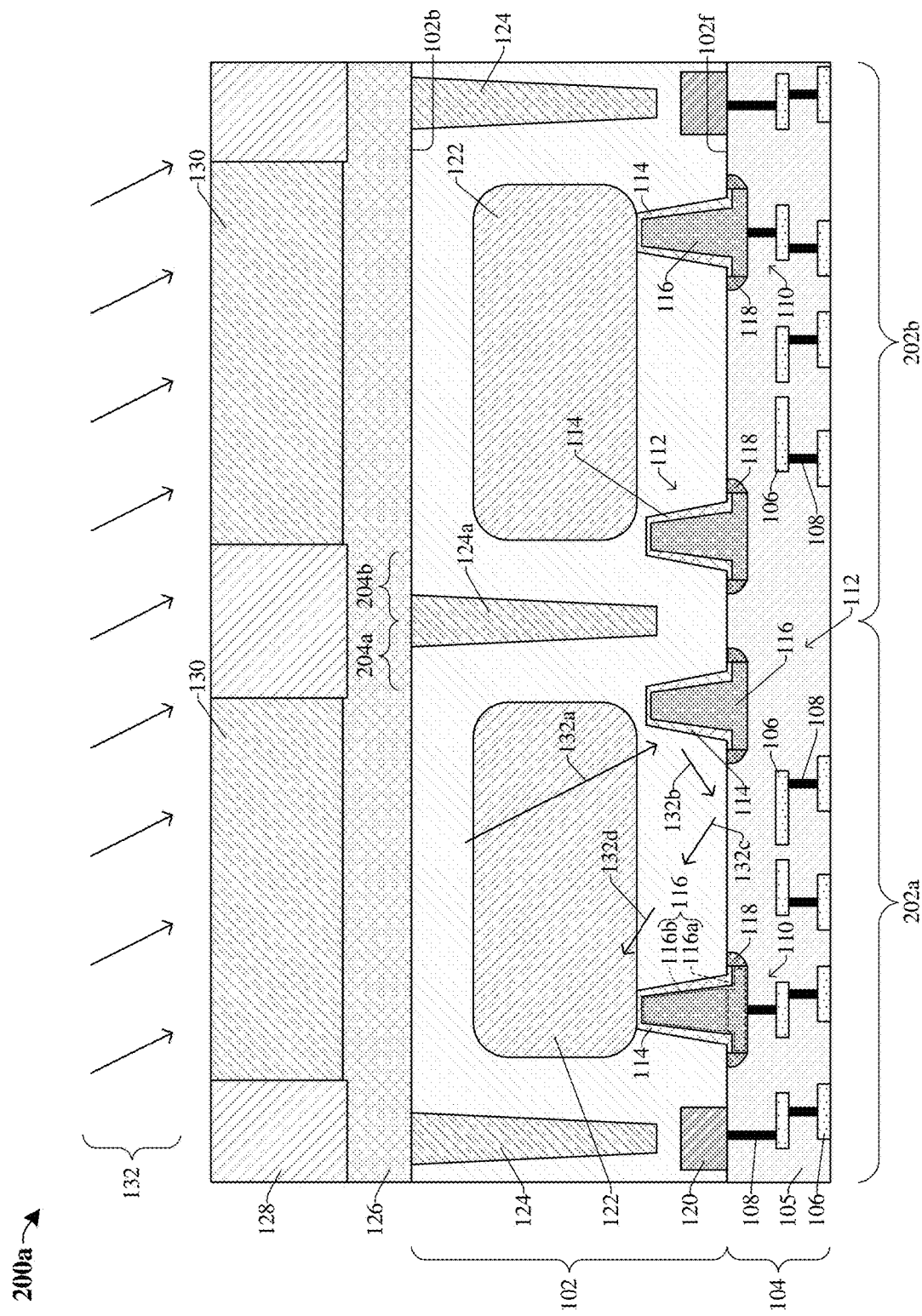
FIGS. 2A-B illustrate cross-sectional views of some embodiments of an image sensor including a first pixel sensor and a second pixel sensor laterally adjacent to one another.

FIG. 2A illustrates a cross-sectional view of some embodiments of an image sensor 200a including a first pixel sensor 202a adjacent to a second pixel sensor 202b. In some embodiments, the first and/or second pixel sensors 202a-b are each configured as the pixel sensor 100 of FIG. 1.

The first pixel sensor 202a is laterally adjacent to the second pixel sensor 202b and a segment 124a of the DTI structure 124 is sandwiched between the first and second pixel sensors 202a-b. A first peripheral region 204a of the first pixel sensor 202a is disposed laterally between the photodetector 122 of the first pixel sensor 202a and the second pixel sensor 202b. A second peripheral region 204b of the second pixel sensor 202b is disposed laterally between the photodetector 122 of the second pixel sensor 202b and the first pixel sensor 202a. As illustrated by the arrows 132a-b (and as described in FIG. 1 above), the dummy vertical transistor structure 112 of the first pixel sensor 202a is configured to redirect incident electromagnetic radiation 132 disposed upon the photodetector 122 of the first pixel sensor 202a away from the first peripheral region 204a. Thus, incident electromagnetic radiation 132 disposed upon the photodetector 122 of the first pixel sensor 202a may not interact with the photodetector 122 of the second pixel sensor 202b, thereby decreasing cross talk between the photodetectors 122 of the first and second pixel sensors 202a-b. This may increase a reliability and accuracy of the image sensor 200a. Further, the dummy vertical transistor structure 112 of the second pixel sensor 202b is configured to redirect incident electromagnetic radiation 132 disposed upon the photodetector of the second pixel sensor 202b away from the second peripheral region 204b. This further decreases cross talk between the photodetectors 122 of the first and second pixel sensors 202a-b.

Figure 2B:
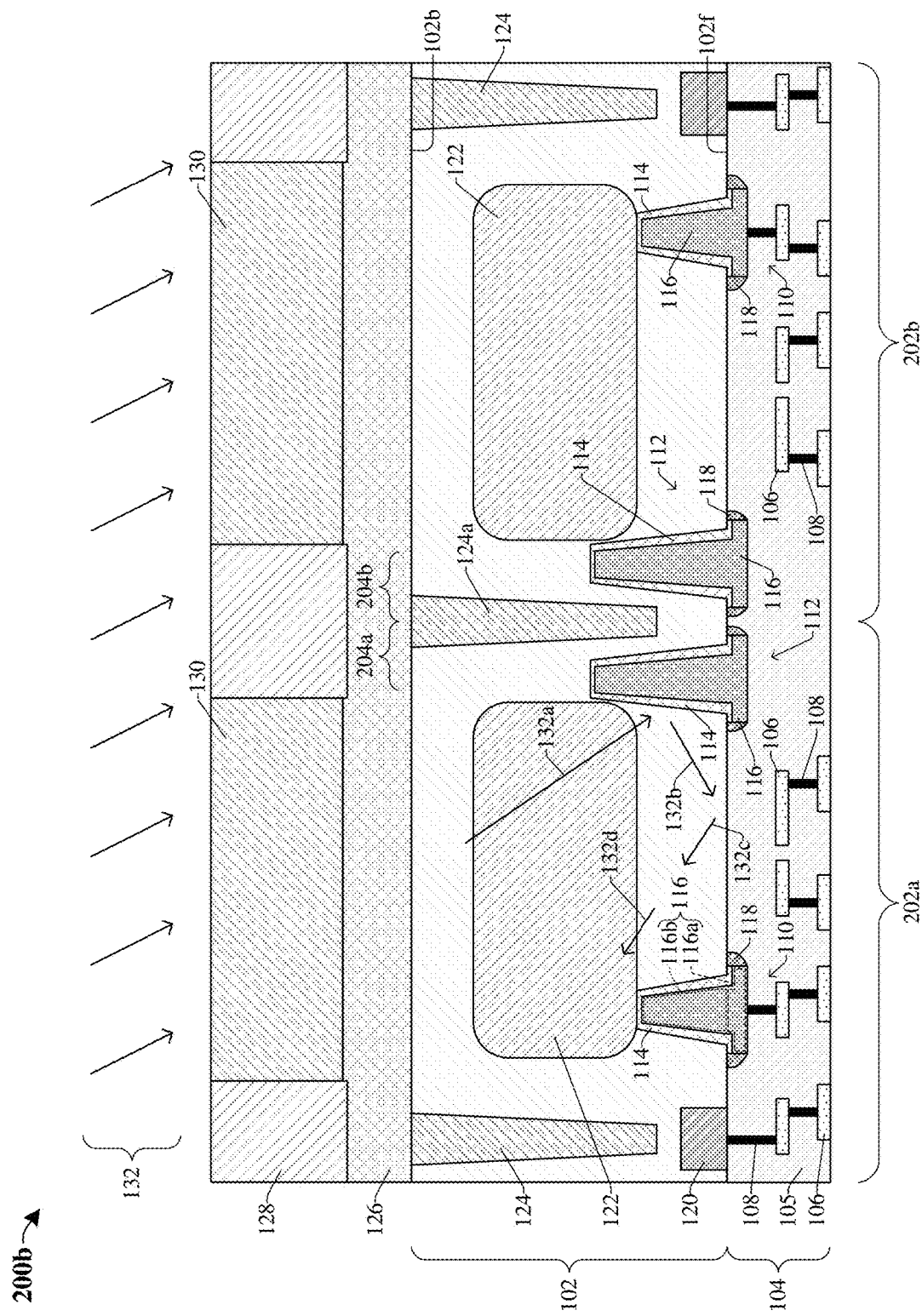

FIG. 2B illustrates a cross-sectional view of an image sensor 200b according to some alternative embodiments of the image sensor 200a of FIG. 2A.

In some embodiments, the dummy vertical transistor structure 112 of the first and second pixel sensors 202a-b each have an upper surface disposed vertically above a bottom surface of a corresponding photodetector 122. Further, each dummy vertical transistor structure 112 is laterally spaced between the corresponding photodetector 122 and the segment 124a of the DTI structure 124. This may increase an ability of the dummy vertical transistor structures 112 to redirect incident electromagnetic radiation 132 away from the first and/or second peripheral regions 204a-b, thereby further decreasing cross talk between the first and second pixel sensors 202a-b.

Figures 3A, 3B:
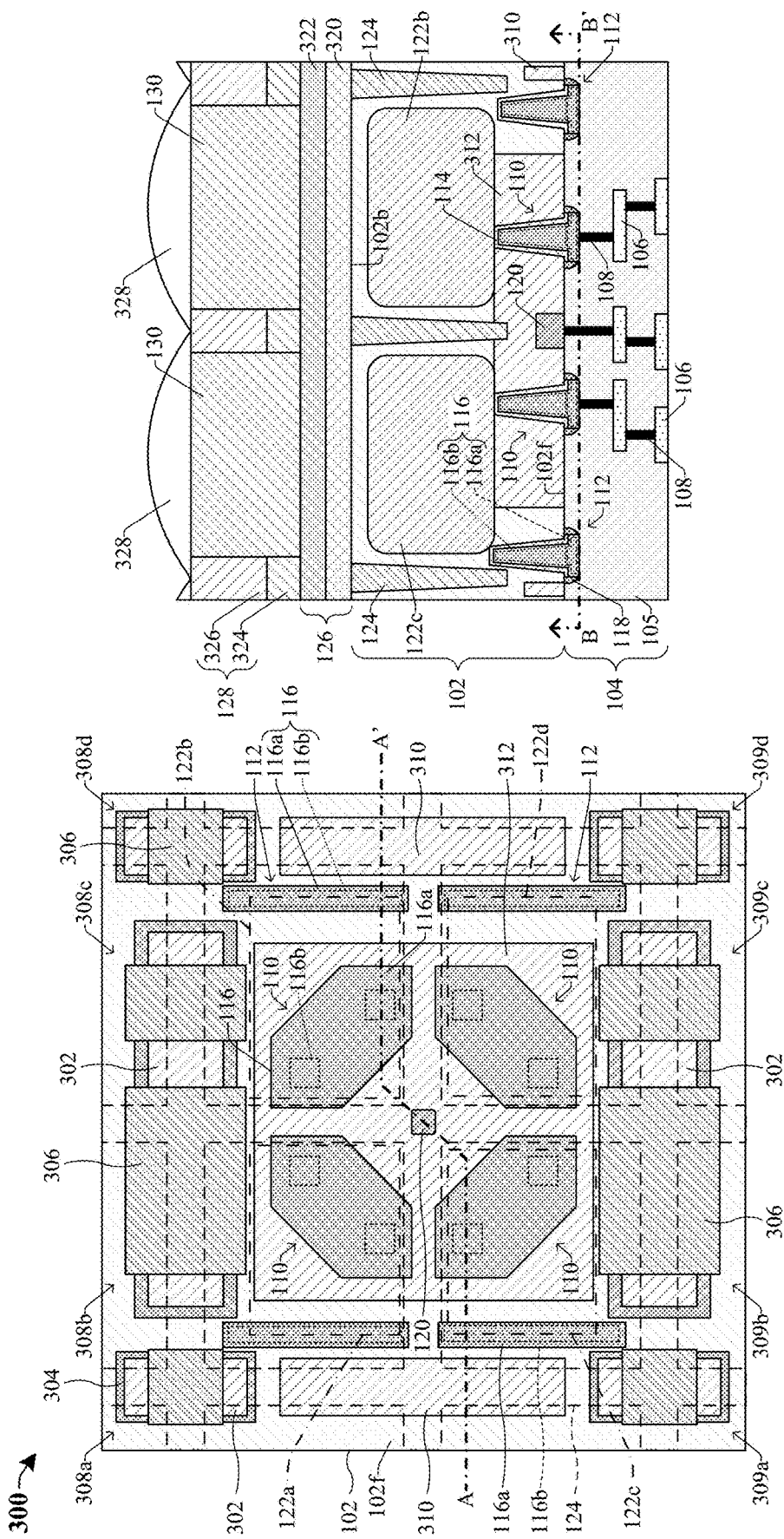
FIG. 3A illustrates a layout view of some embodiments of an image sensor including a dummy vertical transistor structure laterally offset from a vertical transfer transistor.
FIG. 3B illustrates a cross-sectional view of some alternative embodiments of the image sensor of FIG. 2A according to the line A-A' of FIG. 3A.

FIG. 3A illustrates a layout view of some embodiments of a pixel sensors 300 that includes a plurality of photodetectors 122 and a plurality of dummy vertical transistor structures 112. FIG. 3B illustrates some embodiments of a cross-sectional view of the pixel sensor 300 taken along line A-A' of FIG. 3A. FIG. 3A illustrates some embodiments of a layout view taken along line B-B' of the cross-sectional view of FIG. 3B. It may be appreciated that structures and/or layers (e.g., sidewall spacer structures 118, interconnect dielectric structure 105, and conductive vias 108) from the cross-sectional view of FIG. 3B may be omitted from the layout view of FIG. 3A for ease of illustration.

The pixel sensor 300 comprises a plurality of photodetectors 122a-d disposed within the substrate 102. In some embodiments, the substrate 102 comprises any semiconductor body (e.g., monocrystalline silicon/CMOS bulk, silicon-germanium (SeGe), silicon on insulator (SOI), etc.) and/or has a first doping type (e.g., p-type doping). The plurality of photodetectors 122a-d are within the substrate 102 at a point below the front-side surface 102f of the substrate 102 and may comprise a second doping type (e.g., n-type doping) opposite the first doping type. The plurality of photodetectors 122a-d are disposed around a floating diffusion node 120. In some embodiments, a depletion region forms in and/or around each photodetector 122a-d (e.g., due to p-n junctions between the photodetectors 122a-d and p-type doping regions of the substrate 102 surrounding the photodetectors 122a-d). The floating diffusion node 120 comprises the second doping type with a doping concentration greater than the substrate 102.

In some embodiments, the pixel sensor 300 is arrange in an array including a plurality of rows (e.g., along an x-axis) and columns (e.g., along a y-axis) of similar pixel sensors. Each pixel sensor includes a plurality of photodetectors. In further embodiments, the pixel sensor 300 in the array is separated from adjacent pixel sensors by the deep trench isolation (DTI) structure 124. Further, the DTI structure 124 laterally surrounds each photodetector 122a-d. The DTI structure 124 extends from the back-side surface 102b of the substrate 102 to a point below the back-side surface 102b. In some embodiments, the DTI structure 124 extends from the back-side surface 102b to the front-side surface 102f of the substrate 102.

In some embodiments, a plurality of vertical transfer transistors 110 are disposed on the front-side surface 102f of the substrate 102 and are vertically aligned with a corresponding photodetector in the plurality of photodetectors 122a-d. A transfer well region 312 is disposed within the substrate 102 and extends from the front-side surface 102f of the substrate to the photodetectors 122a-d. The transfer well region 312 comprises the first doping type (e.g., p-type doping) with a doping concentration greater than the substrate 102. The vertical transfer transistors 110 are configured to selectively form a conductive channel between the photodetectors 122a-d and the floating diffusion node 120 to transfer accumulated charge (e.g., via absorbing incident radiation) in the photodetectors 122a-d to the floating diffusion node 120. In some embodiments, the selectively formable conductive channel is formed within the transfer well region 312. The vertical transfer transistors 110 each include a vertical gate electrode 116 that comprises a conductive body 116a and an embedded conductive structure 116b. The conductive body 116a extends along the front-side surface 102f of the substrate 102. The embedded conductive structure 116b extends from the front-side surface 102f to a point disposed between the front-side surface 102f and an adjacent photodetector 122a-d.

A first plurality of pixel devices 308a-d are laterally offset from the vertical transfer transistors 110 and may extend along a section of the DTI structure 124. A second plurality of pixel devices 309a-d are laterally offset from the vertical transfer transistors 110 and may extend along another section of the DTI structure 124. In some embodiments, the first and second plurality of pixel devices 308a-d, 309a-d may comprise any number and/or type of pixel devices. For example, a first pixel device 308a may be configured as a reset transistor, a second pixel device 308b may be configured as a source-follow transistor, a third pixel device 308c may be configured as a row-select transistor, and a fourth pixel device 308d may be configured as any of the aforementioned pixel devices or another pixel device. In some embodiments, the fourth pixel device 308d may be configured as a transfer transistor, such that a pixel device gate structure 306 of the fourth pixel device 308d may comprise a same material as the vertical gate electrode 116 and/or may comprise a conductive body overlying an embedded conductive structure. The second plurality of pixel devices 309a-d may be configured as the first plurality of pixel devices 308a-d. For example, a fifth pixel device 309a may be configured as a reset transistor. The pixel devices 308a-d, 309a-d each comprise a pixel device gate structure 306 and source/drain regions 302. The source/drain regions 302 are within the substrate 102 and comprise the second doping type (e.g., n-type doping). In some embodiments, the pixel device gate structure 306 comprises a pixel device electrode (comprising a conductive material such as polysilicon) and a pixel device gate dielectric layer (comprising a dielectric material such as silicon oxide or a high-k dielectric) separating the pixel device electrode from the front-side surface 102f of the substrate 102. The pixel devices 308a-d and/or 309a-d are configured to facilitate digital readout of accumulated charge from the photodetectors 122a-d. In some embodiments, a pixel device isolation structure 304 (e.g., a shallow trench isolation (STI) structure) is disposed on the front-side surface 102f of the substrate 102 and surrounds the source/drain regions 302. In some embodiments, the pixel device isolation structure 304 may, for example, be or comprise silicon nitride, silicon dioxide, or the like. One or more doped regions 310 may extend along the DTI structure 124 and may be or comprise the first doping type (e.g., p-type doping) with a doping concentration greater than the substrate 102. The one or more doped regions 310 may be configured to increase electrical isolation between the pixel sensor 300 and adjacent pixel sensors disposed on the substrate 102.

A plurality of dummy vertical transistor structures 112 are disposed along the front-side surface 102f of the substrate 102. The dummy vertical transistor structures 112 include the vertical gate electrode 116 separated from the substrate 102 by the vertical gate dielectric layer 114. The embedded conductive structure 116b of the dummy vertical transistor structure 112 comprises a same shape as the conductive body 116a of the dummy vertical transistor structure 112, when viewed from above. For example, as illustrated in FIG. 3A, the conductive body 116a and the embedded conductive structure 116b of the dummy vertical transistor structure 112 each have a rectangular shape. The dummy vertical transistor structures 112 are each configured to redirect incident radiation disposed upon the back-side surface 102b of the substrate 102 to an adjacent photodetector 122a-d. This, in part, decreases cross talk between the pixel sensor 300 and adjacent pixel sensors disposed upon the substrate 102.

Further, the embedded conductive structure 116b of the dummy vertical transistor structure 112 extends continuously over a substantial majority of the length and/or width of the conductive body 116a of the dummy vertical transistor structure 112. This, in part, ensures the embedded conductive structure 116b extends across a greater area of the pixel sensor 300, thereby increasing an amount of incident radiation the dummy vertical transistor structures 112 may redirect to the adjacent photodetector 122a-d. In some embodiments, the dummy vertical transistor structures 112 are each vertically aligned with a side of a photodetector in the plurality of photodetectors 122a-d. In such embodiments, the side of the photodetector is spaced laterally between two or more pixel devices. For example, a side of a first photodetector 122a is laterally spaced between the first pixel device 308a and the second pixel device 308b.

In some embodiments, the vertical transfer transistor 110 is disposed along a first side of the first photodetector 122a and the dummy vertical transistor structure 112 is disposed along a second side of the first photodetector 112a opposite the first side. In some embodiments, the embedded conductive structure 116b of the dummy vertical transistor structure continuously extends laterally across the first side of the first photodetector 122a. In such embodiments, the embedded conductive structure 116b of the dummy vertical transistor structure 112 may continuously laterally extend across the first side of the first photodetector 122a, wherein the first side is disposed between opposing sides of the first photodetector 112a.

As illustrated in the cross-sectional view of FIG. 3B, the upper dielectric structure 126 includes a first dielectric layer 320 disposed along the back-side surface 102b of the substrate 102 and a second dielectric layer 322 overlying the first dielectric layer 320. The first dielectric layer 320 may, for example, be an anti-reflection layer configured to mitigate and/or prevent reflection of incident radiation away from the back-side surface 102b. In further embodiments, the first dielectric layer 320 may be a segment of the DTI structure 124 that continuously extends across the back-side surface 102b of the substrate 102. In such embodiments, the first dielectric layer 320 and the DTI structure are a single continuous material. In some embodiments, the first dielectric layer 320 may, for example, be or comprise a high-k dielectric material, silicon oxide, silicon nitride, silicon carbide, or the like. In some embodiments, the second dielectric layer 322 may, for example, be or comprise an oxide, such as silicon dioxide, another suitable dielectric material, or the like.

In some embodiments, the grid structure 128 may include a first grid layer 324 extending across an upper surface of the upper dielectric structure 126 and a second grid layer 326 overlying the first grid layer 324. The first and second grid layers 324, 326 may, for example, each be or comprise a conductive material, such as tungsten, aluminum, copper, a combination of the foregoing, or the like. In further embodiments, the first and second grid layers 324, 326 may be or comprise a conductive material and/or a dielectric material. For example, the second grid layer 326 may be or comprise a dielectric grid structure configured to achieve total internal reflection (TIR) with an adjacent color filter 130, and/or the first grid layer 324 may be or comprise a conductive grid structure (e.g., comprising tungsten, aluminum, copper, etc.) configured to direct incident radiation towards the back-side surface 102b of the substrate 102. A plurality of color filters 130 are disposed over the upper dielectric structure 126, such that the grid structure 128 continuous surrounds the color filters 130. A plurality of micro-lenses are disposed over the color filters 130. The plurality of micro-lenses are configured to focus incident radiation towards the photodetectors 122a-d.

Figure 4:
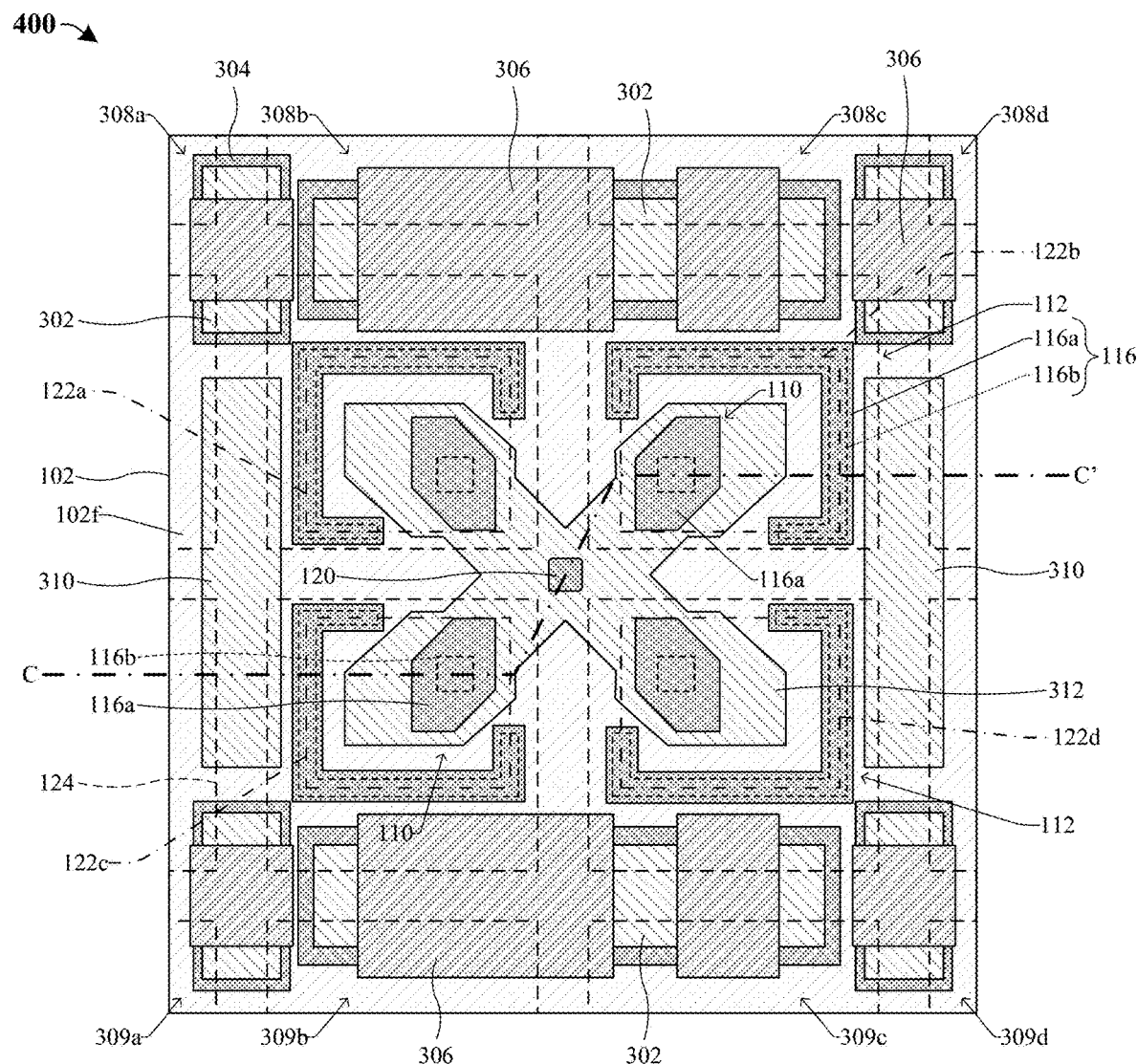
FIG. 4 illustrates a layout view of alternative embodiments of the image sensor of FIG. 3A.

FIG. 4 illustrates a layout view of a pixel sensor 400 according to some alternative embodiments of the pixel sensor 300 of FIG. 3A. FIG. 3B illustrates some embodiments of a cross-sectional view of the pixel sensor 400 taken along line C-C' of FIG. 4. FIG. 4 illustrates some embodiments of a layout view taken long line B-B' of the cross-sectional view of FIG. 3B. It may be appreciated that structures and/or layers (e.g., sidewall spacer structures 118, interconnect dielectric structure 105, and conductive vias 108) from the cross-sectional view of FIG. 3B may be omitted from the layout view of FIG. 4 for ease of illustration.

As illustrated in FIG. 4, the vertical gate electrode 116 of the dummy vertical transistor structure 112 continuously extends along two or more sides of each photodetector 122a-d. In some embodiments, for example, the vertical gate electrode 116 of the dummy vertical transistor structure 112 overlying a first photodetector 122a comprises: a first lateral segment overlying a first side of the first photodetector 122a, a second lateral segment overlying a second side of the first photodetector 122a, a third lateral segment overlying a third side of the first photodetector 122a, and a fourth lateral segment overlying a fourth side of the first photodetector 122a. In such embodiments, the first side of the first photodetector 122a is opposite the third side of the first photodetector 122a, and the second side of the first photodetector 122a is opposite the fourth side of the first photodetector 122a. This, in part, may further increase an ability of the vertical gate electrode 116 of the dummy vertical transistor structure 112 to redirect incident radiation disposed upon the substrate 102 to the first photodetector 122a, thereby further decreasing cross talk between the photodetectors 122a-d and other adjacent photodetectors (not shown).

FIGS. 5-13 illustrate cross-sectional views 500-1300 of some embodiments of a method of forming a pixel sensor having a dummy vertical transistor structure underlying a photodetector. Although the cross-sectional views 500-1300 shown in FIGS. 5-13 are described with reference to a method, it will be appreciated that the structures shown in FIGS. 5-13 are not limited to the method but rather may stand alone separate of the method. Furthermore, although FIGS. 5-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
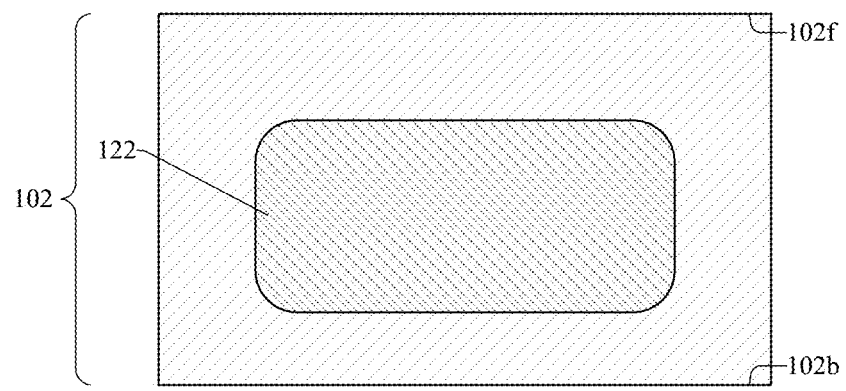
FIGS. 5-13 illustrate cross-sectional views of some embodiments of a method of forming an image sensor that includes a dummy vertical transistor structure underlying a photodetector.

As illustrated in the cross-sectional view 500 of FIG. 5, a substrate 102 is provided and a photodetector 122 is formed in a front-side surface 102f of the substrate 102. In some embodiments, the substrate 102 may, for example, be a bulk substrate (e.g., a bulk silicon substrate), a silicon-on-insulator (SOI) substrate, or some other suitable substrate. In some embodiments, before forming the photodetector 122, a first implant process is performed to dope the substrate 102 with a first doping type (e.g., p-type doping). The photodetector 122 is a region of the substrate 102 having a second doping type (e.g., n-type doping) opposite the first doping type. In some embodiments, the photodetector 122 may be formed by a selective ion implantation process that utilizes a masking layer (not shown) on the front-side surface 102f of the substrate 102 to selectively implant ions into the substrate 102. In further embodiments, other doped regions (not shown) (e.g., the transfer well region 312 and/or the one or more doped regions 310 of FIG. 3A) may be formed before or after forming the photodetector 122 by performing another selective ion implantation process.

Figure 6:
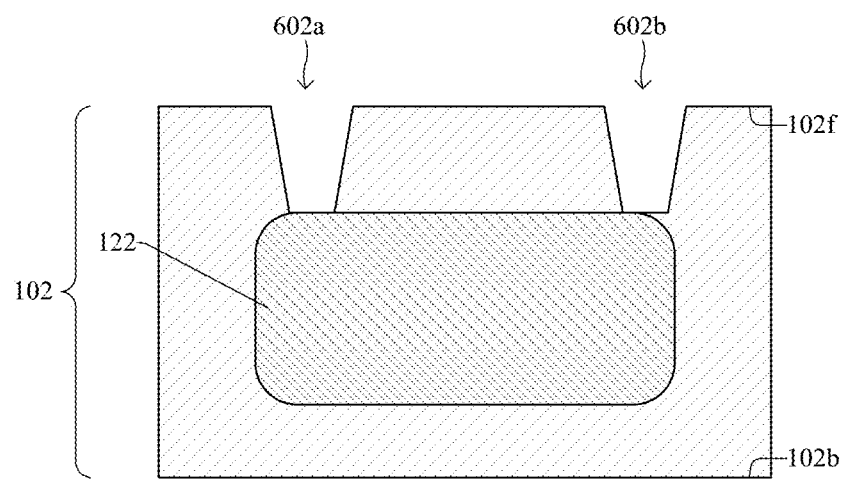

As illustrated in the cross-sectional view 600 of FIG. 6, the substrate 102 is patterned to define a first vertical gate electrode opening 602a and a second vertical gate electrode opening 602b. In some embodiments, the first and second vertical gate electrode openings 602a-b may be disposed on opposite sides of the photodetector 122. In yet further embodiments, when viewed from above, a shape of the first vertical gate electrode opening 602a may have a same shape as the embedded conductive structure (116b of FIG. 3A or 4) of the vertical transfer transistor (110 of FIG. 3A or 4) of FIG. 3A or 4. In such embodiments, when viewed from above, a shape of the second vertical gate electrode opening 602b may have a same shape as the embedded conductive structure (116b of FIG. 3A or 4) of the dummy vertical transistor structure (112 of FIG. 3A or 4) of FIG. 3A or 4. In some embodiments, a process for forming the first and second vertical gate electrode openings 602a-b may include: forming a masking layer over the front-side surface 102f of the substrate 102; exposing unmasked regions of the substrate 102 to one or more etchants, thereby defining the first and second vertical gate electrode openings 602a-b; and performing a removal process to remove the masking layer.

Figure 7:
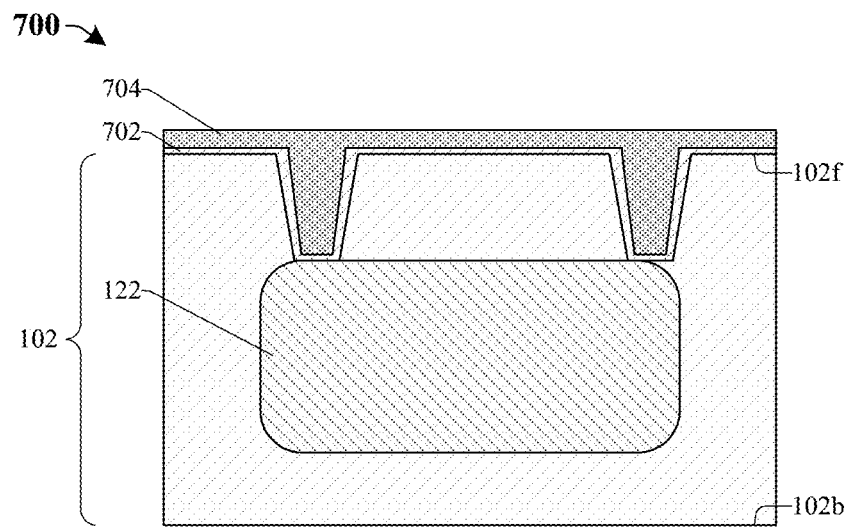

As illustrated by the cross-sectional view 700 of FIG. 7, a gate dielectric layer 702 is formed over the substrate 102 and a gate electrode layer 704 is formed over the gate dielectric layer 702. In some embodiments, the gate dielectric layer 702 may, for example, be or comprise silicon dioxide, a high-k dielectric material, another suitable dielectric material, or the like. In some embodiments, the gate electrode layer 704 may, for example, be or comprise intrinsic polysilicon, doped polysilicon, tungsten, titanium, tantalum, tungsten, a combination or the foregoing, or the like. In some embodiments, the gate dielectric layer 702 may, for example, be formed by chemical vapor deposition (CVD), physical vapor deposition (PVD), atomic layer deposition (ALD), thermal oxidation, or another suitable deposition or growth process. Further, the gate dielectric layer 702 may line the first and second vertical gate electrode openings (602a-b of FIG. 6). In some embodiments, the gate electrode layer 704 may, for example, be formed by CVD, PVD, sputtering, electroless plating, or another suitable growth or deposition process. The gate electrode layer 704 may fill a remaining portion of the first and second vertical gate electrode openings (602a-b of FIG. 6).

Figure 8:
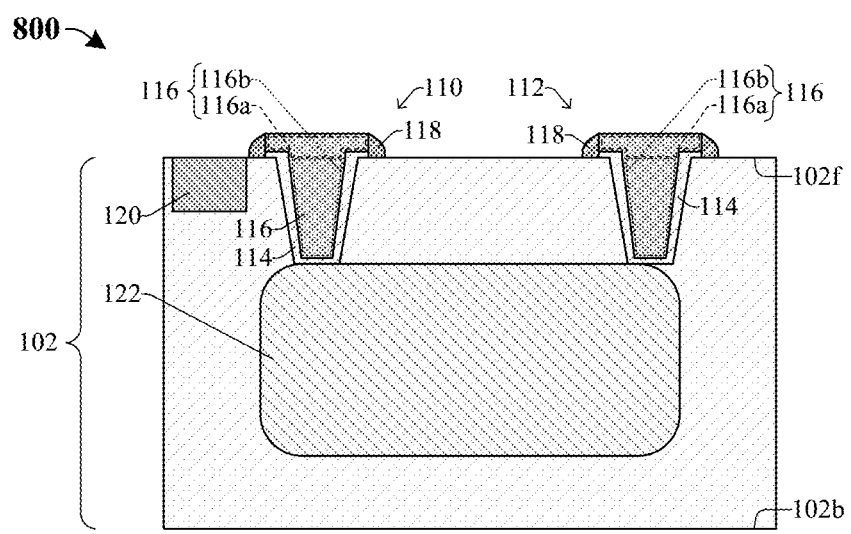

As illustrated by the cross-sectional view 800 of FIG. 8, a patterning process is performed on the gate dielectric layer (702 of FIG. 7) and the gate electrode layer (704 of FIG. 7), thereby defining vertical gate dielectric layers 114 and vertical gate electrodes 116, respectively. Further, sidewall spacer structures 118 are formed around sidewalls of the vertical gate dielectric layers 114 and the vertical gate electrodes 116. This, in part, defines a vertical transfer transistor 110 and a dummy vertical transistor structure 112. Thus, in some embodiments, the vertical transfer transistor 110 and the dummy vertical transistor structure 112 are formed concurrently. Subsequently, a floating diffusion node 120 is formed in the substrate 102 adjacent to the vertical transfer transistor 110. The floating diffusion node 120 may comprise the second doping type (e.g., n-type doping). In some embodiments, the floating diffusion node 120 may be formed by a selective ion implantation process that utilizes a masking layer (not shown) on the front-side surface 102f of the substrate 102 to selectively implant ions into the substrate 102. In further embodiments, other doped regions (not shown) (e.g., the source/drain regions 302 of FIG. 3A) may be formed concurrently with the floating diffusion node 120.

Also illustrated in the cross-sectional view 800 of FIG. 8, the vertical gate electrode 116 includes a conductive body 116a and an embedded conductive structure 116b extending from the conductive body 116a into the substrate 102. The embedded conductive structure 116b extends from the front-side surface 102f of the substrate 102 to a point vertically above the front-side surface 102f. The vertical gate dielectric layer 114 continuously surrounds the embedded conductive structure 116b and is configured to electrically isolate the vertical gate electrode 116 from the substrate 102 and/or the photodetector 122. The sidewall spacer structure 118 continuously surrounds outer sidewalls of the vertical gate electrode 116. In some embodiments, the vertical gate electrode 116 is a single continuous material, such that the conductive body 116a and the embedded conductive structure 116b comprise a same material. Further, when viewed from above, the vertical gate electrode 116 of the vertical transfer transistor 110 may have a same shape as illustrated in the layout views of FIG. 3A or 4. Furthermore, when viewed from above, the vertical gate electrode 116 of the dummy vertical transistor structure 112 may have a same shape as illustrated/described in the layout views of FIGS. 3A and 4.

Figure 9:
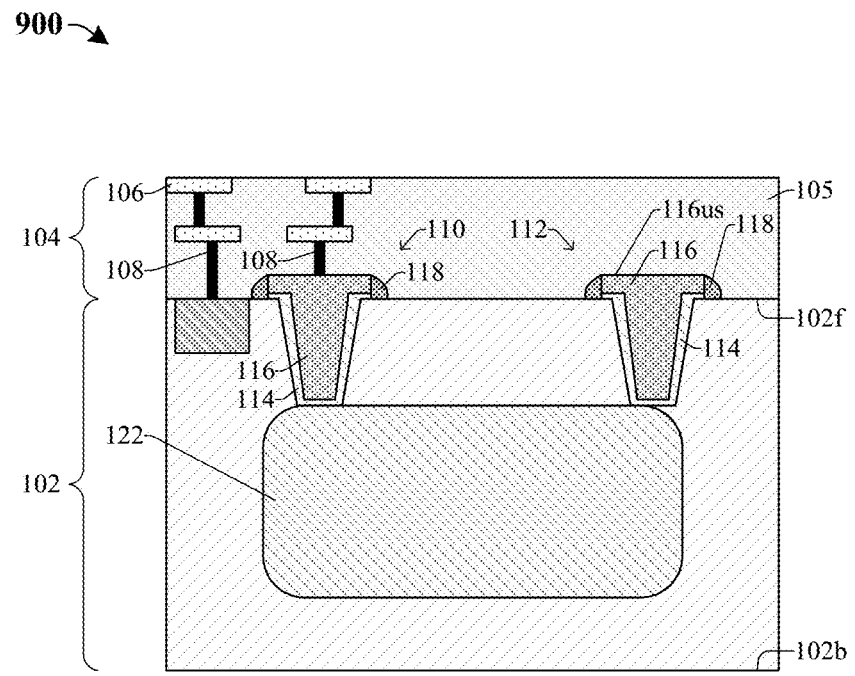

As illustrated by the cross-sectional view 900 of FIG. 9, an interconnect structure 104 is formed over the front-side surface 102f of the substrate 102. The interconnect structure 104 includes an interconnect dielectric structure 105, a plurality of conductive wires 106, and a plurality of conductive vias 108. In some embodiments, the interconnect dielectric structure 105 may, for example, be or comprise an oxide (e.g., silicon dioxide), a nitride, a low-k dielectric, another suitable dielectric material, or the like. The interconnect dielectric structure 105 may be formed by CVD, PVD, ALD, or another suitable deposition process. The plurality of conductive wires 106 and/or the plurality of conductive vias 108 may be formed by a single damascene process or by a dual damascene process. The plurality of conductive wires and vias 106, 108 may, for example, each be or comprise aluminum, copper, tungsten, titanium nitride, a combination of the foregoing, or the like.

Also illustrated in the cross-sectional view 900 of FIG. 9, the interconnect dielectric structure 105 may continuously extend over an upper surface 116us of the vertical gate electrode 116 of the dummy vertical transistor structure 112. For example, the interconnect dielectric structure 105 may continuously extend between opposing sidewalls of the vertical gate electrode 116 of the dummy vertical transistor structure 112. In such embodiments, conductive structure(s) and/or layer(s) (e.g., the conductive wires and/or vias 106, 108) of the interconnect structure 104 do not contact the vertical gate electrode 116 of the dummy vertical transistor structure 112. Thus, in such embodiments, the vertical gate electrode 116 of the dummy vertical transistor structure 112 is electrically isolated from the conductive structure(s) and/or layer(s) of the interconnect structure 104. In some embodiments, a conductive via 108 directly contacts the vertical gate electrode 116 of the vertical transfer transistor 110, thus the vertical gate electrode 116 is electrically coupled to the conductive structure(s) and/or layer(s) of the interconnect structure 104.

Figure 10:
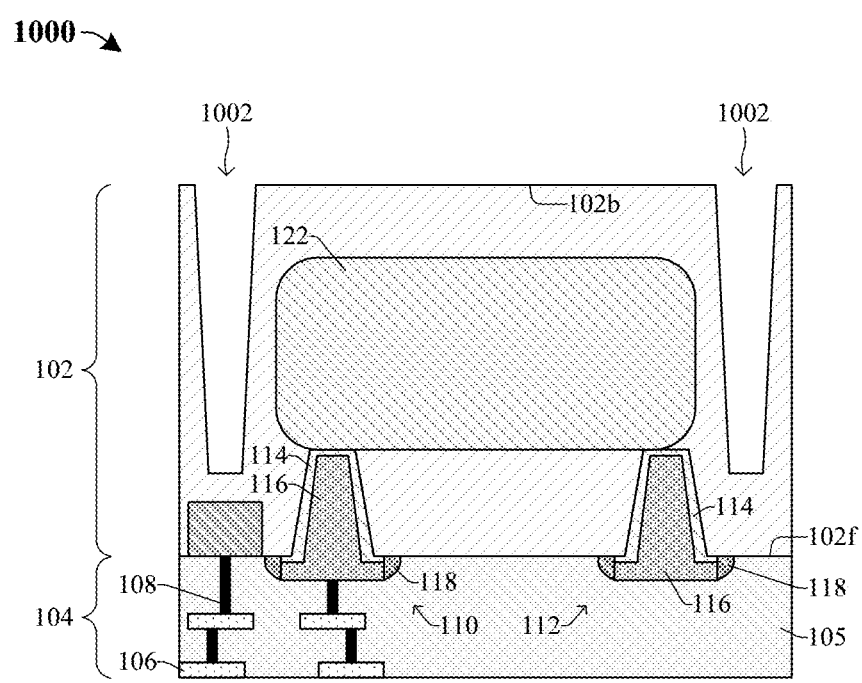

As illustrated by the cross-sectional view 1000 of FIG. 10, the structure of FIG. 9 is flipped and a patterning process is performed into the back-side surface 102b of the substrate 102, thereby defining a deep trench isolation (DTI) opening 1002. In some embodiments, the patterning process includes: forming a masking layer (not shown) over the back-side surface 102b of the substrate 102; exposing unmasked regions of the substrate 102 to one or more etchants, thereby defining the DTI opening 1002; and performing a removal process to remove the masking layer.

Figure 11:
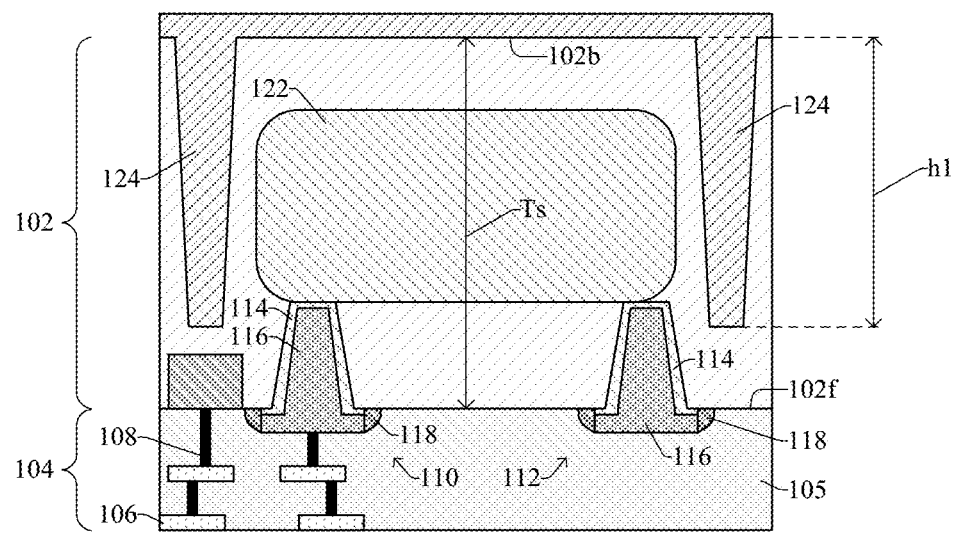

As illustrated by the cross-sectional view 1100 of FIG. 11, a DTI structure 124 is formed over the back-side surface 102b of the substrate 102, thereby filling the DTI opening (1002 of FIG. 10). In some embodiments, the DTI structure 124 may, for example, be or comprise an oxide, such as silicon dioxide, another suitable oxide, or the like. In some embodiments, the DTI structure 124 is formed by an ALD process. Further, in some embodiments, after depositing the DTI structure 124 by the ALD process, a planarization process (e.g., chemical mechanical planarization (CMP)) process is performed on the DTI structure 124, such that the DTI structure 124 has a substantially flat upper surface. In some embodiments, a segment of the DTI structure 124 extending from the back-side surface 102b of the substrate 102 to a point below the back-side surface 102b has a height h1. In some embodiments, the height h1 is about 2.8 micrometers or within a range of about 2.6 to 3.0 micrometers. Further, the substrate 102 has a thickness Ts defined between the front-side surface 102f and the back-side surface 102b. In some embodiments, the thickness Ts is about 3.5 micrometers or within a range of about 3.3 to 3.7 micrometers.

Figure 12:
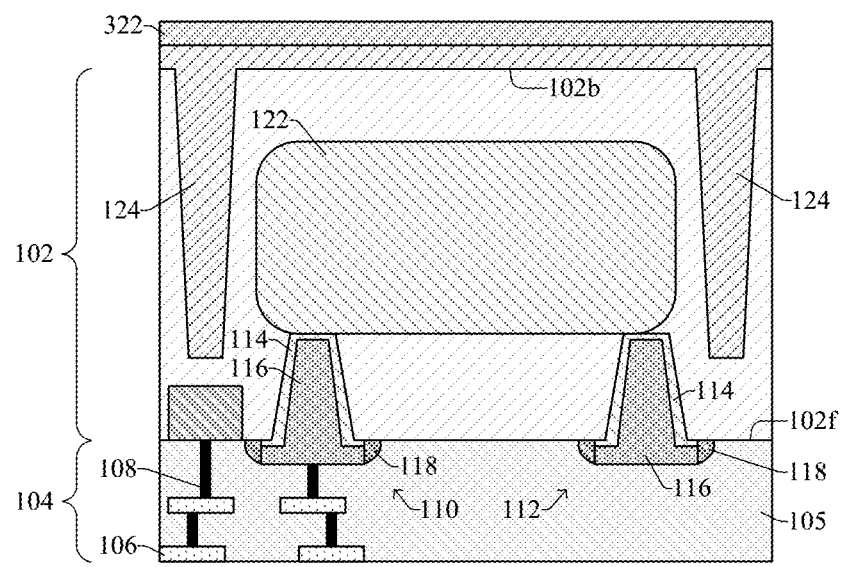

As illustrated by the cross-sectional view 1200 of FIG. 12, a second dielectric layer 322 is formed over the upper surface of the DTI structure 124. The second dielectric layer 322 may be formed by, for example, CVD, PVD, ALD, thermal oxidation, or another suitable growth or deposition process. The second dielectric layer 322 may, for example, be or comprise an oxide, such as silicon dioxide, or another suitable dielectric material. In some embodiments, after depositing the second dielectric layer 322, a planarization process (e.g., a CMP) is performed on the second dielectric layer 322, such that the second dielectric layer 322 has a substantially flat upper surface.

Figure 13:
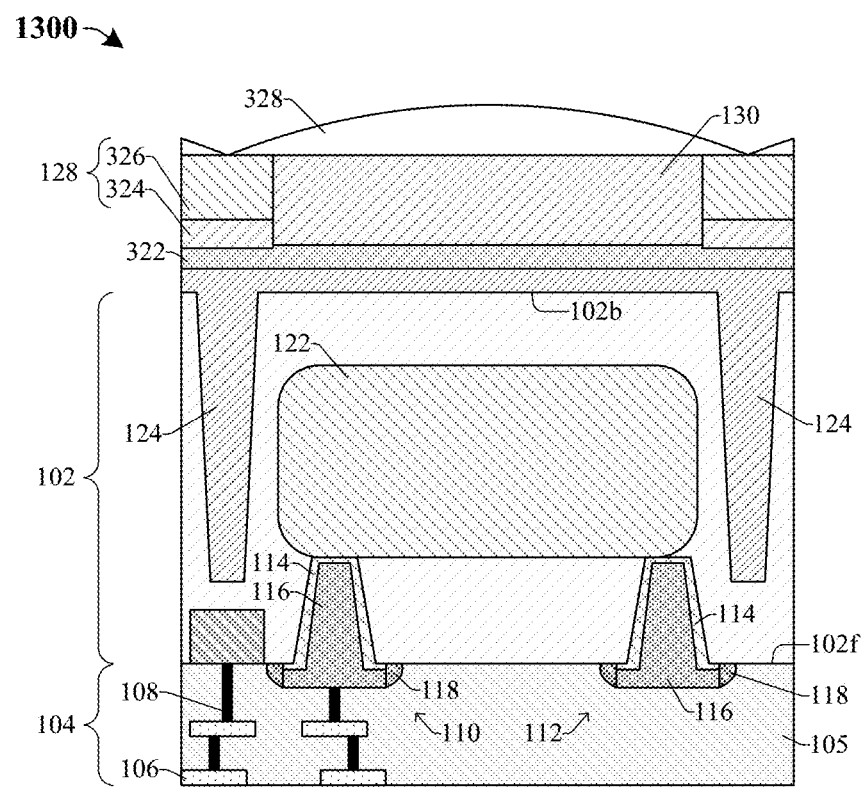

As illustrated by the cross-sectional view 1300 of FIG. 13, a grid structure 128 and a color filter 130 are formed over the second dielectric layer 322. In some embodiments, the grid structure 128 may include a first grid layer 324 extending across an upper surface of the second dielectric layer 322 and a second grid layer 326 overlying the first grid layer 324. In some embodiments, the first and/or second grid layers 324, 326 may, for example, be or comprise a dielectric material and/or a conductive material. In further embodiments, the first and/or second grid layers 324, 326 may be formed by, for example, CVD, PVD, ALD, sputtering, electroless plating, or another suitable growth or deposition process. Further, after depositing first and second grid layers 324, 326, a patterning process may be performed on the first and second grid layers 324, 326 to define a color filter opening. Subsequently, the color filter 130 may be formed in the color filter opening, such that the grid structure 128 continuously surrounds the color filter 130. In further embodiments, the color filter 130 may be formed by forming various color filter layers and patterning the color filter layers. The color filter layers are formed of material that allows for the transmission of incident radiation (e.g., light) having a specific wavelength range, while blocking light of wavelengths outside of the specified range. Further, in some embodiments, the color filter layers may be planarized (e.g., via CMP) subsequent to formation.

Also illustrated in the cross-sectional view 1300 of FIG. 13, a plurality of micro-lenses 328 are formed over the substrate 102. In some embodiments, the micro-lenses 328 may be formed by depositing a micro-lens material over the substrate 102 (e.g., by a spin-on method or a deposition process). A micro-lens template (not shown) having a curved upper surface is patterned above the micro-lens material. The micro-lenses 328 are then formed by selectively etching the micro-lens material according to the micro-lens template.

Figure 14:
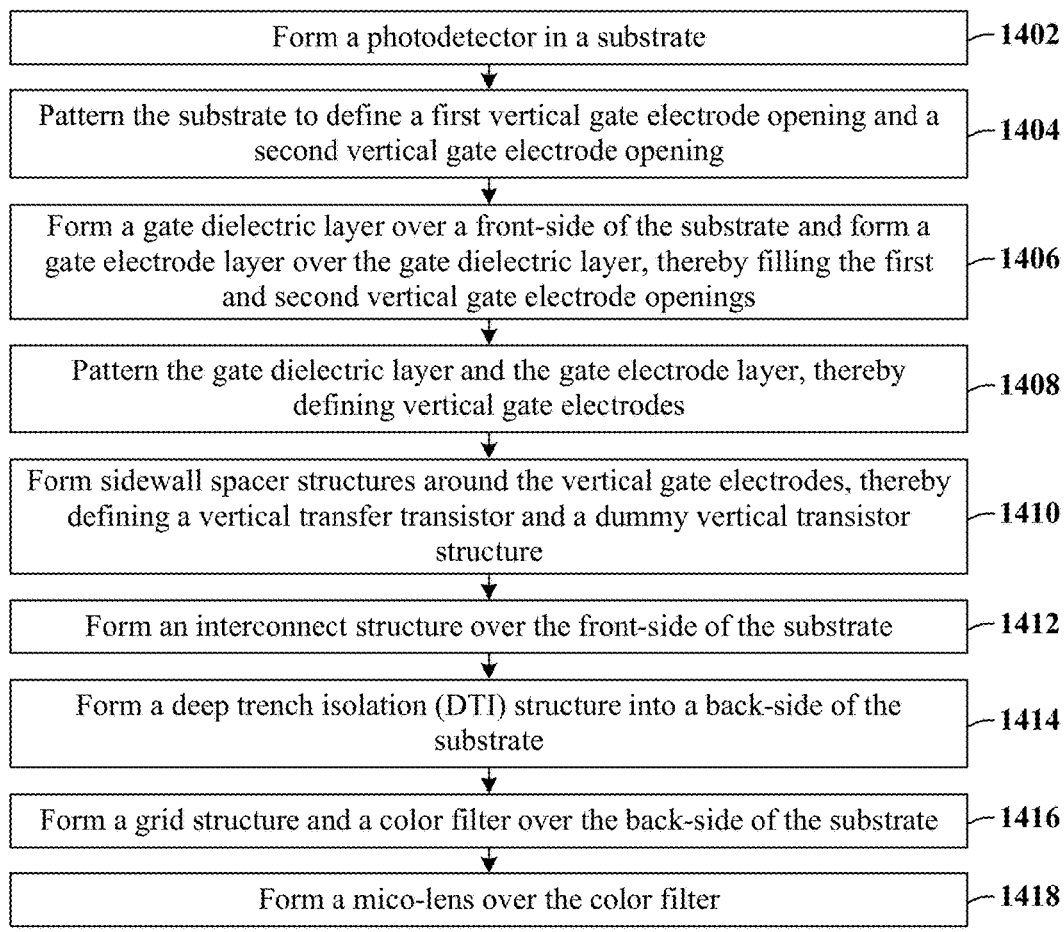
FIG. 14 illustrates a methodology in flowchart format that illustrates some embodiments of a method of forming an image sensor having a dummy vertical transistor structure underlying a photodetector.

FIG. 14 illustrates a method 1400 of forming a pixel sensor having a dummy vertical transistor structure underlying a photodetector according to the present disclosure. Although the method 1400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, a photodetector is formed in a substrate. FIG. 5 illustrates a cross-sectional view 500 corresponding to some embodiments of act 1402.

At act 1404, the substrate is patterned to define a first vertical gate electrode opening and a second vertical gate electrode opening. FIG. 6 illustrates a cross-sectional view 600 corresponding to some embodiments of act 1404.

At act 1406, a gate dielectric layer is formed over a front-side of the substrate and a gate electrode layer is formed over the gate dielectric layer, thereby filling the first and second vertical gate electrode openings. FIG. 7 illustrates a cross-sectional view 700 corresponding to some embodiments of act 1406.

At act 1408, the gate dielectric layer and the gate electrode layer are patterned, thereby defining vertical gate electrodes. FIG. 8 illustrates a cross-sectional view 800 corresponding to some embodiments of act 1408.

At act 1410, sidewall spacer structures are formed around the vertical gate electrodes, thereby defining a vertical transfer transistor and a dummy vertical transistor structure. FIG. 8 illustrates a cross-sectional view 800 corresponding to some embodiments of act 1410.

At act 1412, an interconnect structure is formed over the front-side of the substrate. FIG. 9 illustrates a cross-sectional view 900 corresponding to some embodiments of act 1412.

At act 1414, a deep trench isolation (DTI) structure is formed into a back-side of the substrate. FIGS. 10 and 11 illustrate cross-sectional views 1000 and 1100 corresponding to some embodiments of act 1414.

At act 1416, a grid structure and a color filter are formed over the back-side of the substrate. FIG. 13 illustrates a cross-sectional view 1300 corresponding to some embodiments of act 1416.

At act 1418, a micro-lens is formed over the color filter. FIG. 13 illustrates a cross-sectional view 1300 corresponding to some embodiments of act 1418.

Accordingly, in some embodiments, the present disclosure relates to a dummy vertical transistor structure underlying a photodetector and laterally offset from a vertical transfer transistor.

In some embodiments, the present application provides a pixel sensor including a substrate having a front-side surface opposite a back-side surface; a photodetector disposed within the substrate; a deep trench isolation (DTI) structure extending from the back-side surface of the substrate to a first point below the back-side surface, wherein the DTI structure wraps around an outer perimeter of the photodetector; and a dummy vertical transistor structure underlying the photodetector and laterally spaced between inner sidewalls of the DTI structure, wherein the dummy vertical transistor structure includes a dummy vertical gate electrode with a dummy conductive body and a dummy embedded conductive structure, wherein the dummy embedded conductive structure extends from the front-side surface of the substrate to a second point vertically above the first point and the dummy conductive body extends along the front-side surface of the substrate.

In some embodiments, the present application provides an image sensor including a substrate having a front-side surface and a back-side surface opposite the front-side surface; an interconnect structure disposed along the front-side surface, wherein the interconnect structure includes conductive vias and conductive wires disposed within an interconnect dielectric structure; a first pixel sensor including a first photodetector disposed within the substrate, a first vertical transfer transistor underlying the first photodetector, and a first dummy vertical transistor structure disposed along the front-side surface; a second pixel sensor including a second photodetector disposed within the substrate, a second vertical transfer transistor underlying the second photodetector, and a second dummy vertical transistor structure disposed along the front-side surface; a deep trench isolation (DTI) structure disposed within the substrate and laterally surrounding the first and second pixel sensors, wherein a central segment of the DTI structure is spaced laterally between the first and second pixel sensors; and wherein the first dummy vertical transistor structure is spaced laterally between the first photodetector and the central segment of the DTI structure and the second dummy vertical transistor structure is spaced laterally between the second photodetector and the central segment of the DTI structure.

In some embodiments, the present application provides a method for forming a pixel sensor, the method includes forming a photodetector in a substrate; patterning the substrate to define a first vertical gate electrode opening and a second vertical gate electrode opening; forming a vertical gate electrode and a dummy vertical gate electrode in the first and second vertical gate electrode openings, respectively; and forming sidewall spacer structures around the vertical gate electrode and the dummy vertical gate electrode, thereby defining a vertical transfer transistor and a dummy vertical transfer transistor, respectively, wherein the vertical transfer transistor is laterally offset from the dummy vertical transfer transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel sensor, comprising:
   a substrate comprising a front-side surface opposite a back-side surface;
   a photodetector disposed within the substrate;
   a deep trench isolation (DTI) structure extending from the back-side surface of the substrate to a first point below the back-side surface, wherein the DTI structure wraps around an outer perimeter of the photodetector;
   a vertical transfer transistor underlying the photodetector and disposed between inner sidewalls of the DTI structure, wherein the vertical transfer transistor comprises a transfer vertical gate electrode, wherein the vertical transfer transistor is disposed along a first side of the photodetector; and
   a dummy vertical transistor structure underlying the photodetector and laterally spaced between the inner sidewalls of the DTI structure, wherein the dummy vertical transistor structure comprises a dummy vertical gate electrode with a dummy conductive body and a dummy embedded conductive structure, wherein the dummy embedded conductive structure extends from the front-side surface of the substrate to a second point vertically above the first point and the dummy conductive body extends along the front-side surface of the substrate, wherein the dummy vertical transistor structure is disposed along a second side of the photodetector opposite the first side of the photodetector.

2. The pixel sensor of claim 1,
   wherein the vertical transfer transistor is laterally offset from the dummy vertical transistor structure, wherein the transfer vertical gate electrode and the dummy vertical gate electrode comprise a same conductive material.

3. The pixel sensor of claim 2, wherein the same conductive material is intrinsic polysilicon.

4. The pixel sensor of claim 2, wherein the vertical transfer transistor and the dummy vertical transistor structure comprise a vertical gate dielectric layer and a sidewall spacer structure, respectively, wherein the vertical gate dielectric layer separates the dummy vertical gate electrode and the transfer vertical gate electrode from the substrate, and wherein the sidewall spacer structure surrounds outer sidewalls of the vertical gate dielectric layer, outer sidewalls of the dummy vertical gate electrode, and outer sidewalls of the transfer vertical gate electrode.

5. The pixel sensor of claim 2, wherein a bottom surface of the vertical transfer transistor is aligned with a bottom surface of the dummy vertical transistor structure.

6. The pixel sensor of claim 2, further comprising:
   an interconnect structure disposed along the front-side surface of the substrate, wherein the interconnect structure comprises a plurality of conductive vias and a plurality of conductive wires disposed within an interconnect dielectric structure, wherein the vertical transfer transistor is electrically coupled to the conductive wires and vias, and wherein the dummy vertical transistor structure is electrically isolated from the conductive vias and wires.

7. The pixel sensor of claim 6, wherein a conductive via within the plurality of conductive vias directly contacts a bottom surface of the vertical transfer transistor, wherein the interconnect dielectric structure continuously extends across a bottom surface of the dummy vertical transistor structure.

8. The pixel sensor of claim 1, wherein the dummy embedded conductive structure comprises a first lateral segment extending in parallel with a first inner sidewall of the DTI structure, a second lateral segment extending in parallel with a second inner sidewall of the DTI structure, and a third lateral segment extending in parallel with a third inner sidewall of the DTI structure, wherein the first and third inner sidewalls of the DTI structure are opposite one another.

9. A pixel sensor, comprising:
   a substrate comprising a front-side surface opposite a back-side surface;
   a photodetector disposed within the substrate;
   a deep trench isolation (DTI) structure extending into the back-side surface of the substrate such that the photodetector is spaced laterally between a first sidewall of the DTI structure and a second sidewall of the DTI structure;
   a transfer vertical gate electrode underlying the photodetector and extending into the front-side surface of the substrate, wherein the transfer vertical gate electrode is disposed laterally between the first sidewall of the DTI structure and a center of the photodetector; and
   a dummy vertical gate electrode underlying the photodetector and extending into the front-side surface of the substrate, wherein the dummy vertical gate electrode is disposed laterally between the second sidewall of the DTI structure and the center of the photodetector.

10. The pixel sensor of claim 9, further comprising:
    a floating diffusion node disposed within the substrate and underlying the first sidewall of the DTI structure, wherein the transfer vertical gate electrode is disposed laterally between the floating diffusion node and the dummy vertical gate electrode.

11. The pixel sensor of claim 9, wherein bottom surfaces of the transfer vertical gate electrode and the dummy vertical gate electrode are disposed vertically between a bottom surface of the photodetector and a bottom surface of the DTI structure.

12. The pixel sensor of claim 9, wherein a first planar sidewall of the dummy vertical gate electrode faces a first direction towards the transfer vertical gate electrode and a second planar sidewall of the dummy vertical gate electrode faces a second direction towards the transfer vertical gate electrode.

13. The pixel sensor of claim 12, wherein the first direction is orthogonal to the second direction.

14. The pixel sensor of claim 9, wherein the transfer vertical gate electrode is laterally offset from the first sidewall of the DTI structure by a non-zero distance in a direction towards the center of the photodetector, wherein at least a portion of the dummy vertical gate electrode directly underlies the second sidewall of the DTI structure.

15. A pixel sensor, comprising:
    a substrate comprising a front-side surface opposite a back-side surface;
    a photodetector disposed within the substrate;
    a floating diffusion node disposed within the substrate and adjacent to a first side of the photodetector;
    a deep trench isolation (DTI) structure extending from the back-side surface of the substrate to a first point below the back-side surface, wherein the photodetector is spaced laterally between opposing sidewalls of the DTI structure;
    an interconnect structure disposed along the front-side surface of the substrate, wherein the interconnect structure comprises a plurality of conductive vias and a plurality of conductive wires disposed within an interconnect dielectric structure; and a dummy vertical gate electrode directly underlying the photodetector and extending into the front-side surface of the substrate, wherein the dummy vertical gate electrode is adjacent to a second side of the photodetector opposite the first side.

16. The pixel sensor of claim 15, wherein the dummy vertical gate electrode is electrically isolated from the conductive vias and wires.

17. The pixel sensor of claim 16, further comprising:
a transfer vertical gate electrode directly underlying the photodetector and extending into the front-side surface of the substrate, wherein the transfer vertical gate electrode is disposed laterally between the opposing sidewalls of the DTI structure.

18. The pixel sensor of claim 15, wherein the dummy vertical gate electrode is laterally offset from the floating diffusion node by a non-zero distance.

19. The pixel sensor of claim 17, wherein a top surface of the transfer vertical gate electrode is disposed vertically between a top surface of the dummy vertical gate electrode and the first point.

20. The pixel sensor of claim 17, wherein the transfer vertical gate electrode is disposed laterally between the floating diffusion node and the dummy vertical gate electrode.

* * * * *